Figure 1:
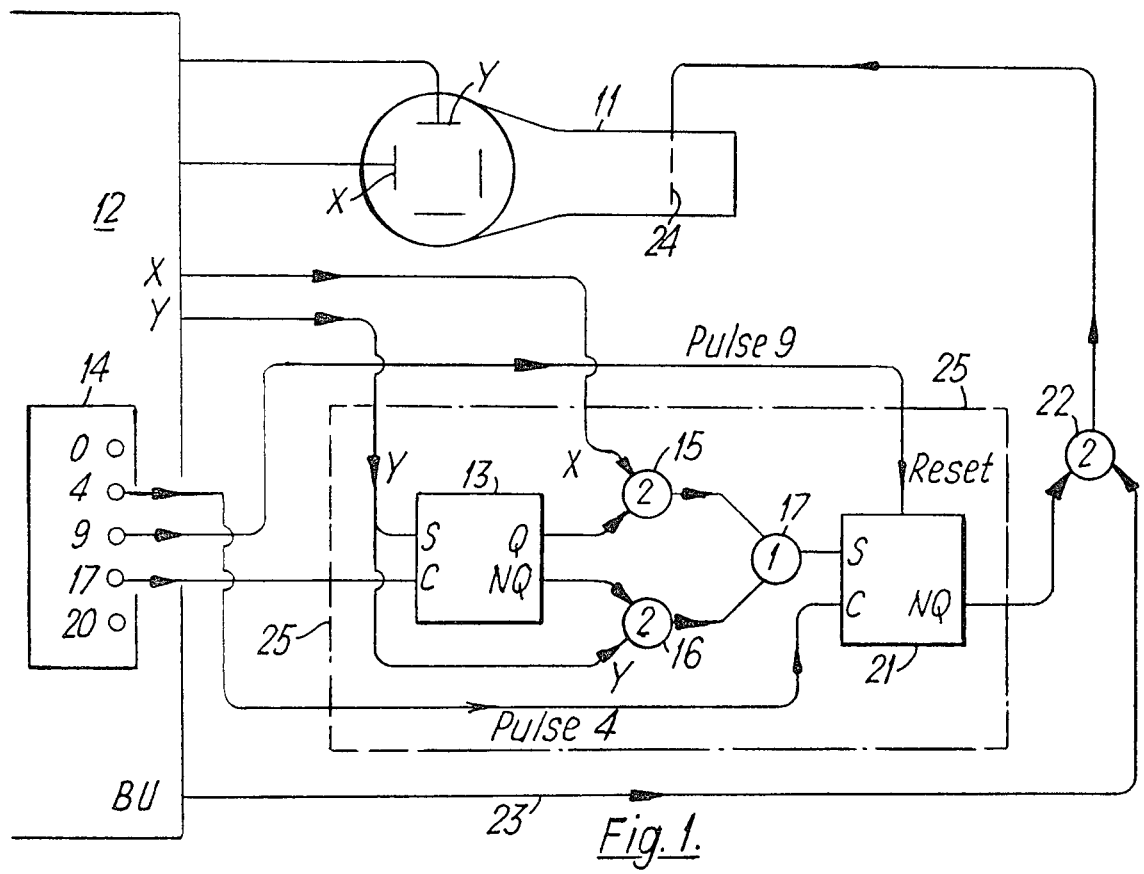

United States Patent [19]
English et al.

[11] 3,965,389
[45] June 22, 1976

[54] BEAMED-INTENSITY CONTROL SYSTEMS FOR CATHODE-RAY TUBES

[75] Inventors: Brian Box English; Frederick Cross, both of Edinburgh, Scotland

[73] Assignee: Ferranti, Limited, Hollinwood, England

[22] Filed: Aug. 29, 1973

[21] Appl. No.: 392,440

Related U.S. Application Data

[63] Continuation of Ser. No. 139,467, May 3, 1971, abandoned.

[30] Foreign Application Priority Data

May 9, 1970 United Kingdom............... 22540/70

[52] U.S. Cl. .............................. 315/384; 307/232; 328/110
[51] Int. Cl.² .......................................... H01J 29/52
[58] Field of Search .......... 315/383, 384, 385, 379, 315/364; 307/218, 232; 328/94, 109, 110

[56] References Cited
UNITED STATES PATENTS

| 3,482,309 | 12/1969 | Bouchard | 315/383 |
| 3,591,853 | 7/1971 | Jarvis et al. | 307/218 X |
| 3,718,834 | 2/1973 | Bacon et al. | 315/383 |

Primary Examiner—T.H. Tubbesing
Attorney, Agent, or Firm—Cameron, Kerkam, Sutton, Stowell & Stowell

[57] ABSTRACT

A logical circuit for maintaining uniform the density of the trace made on a photographic negative by the beam of a CR tube where the beam is subject to displacements in X and Y coordinate directions. The circuit includes a first bistable stage which represents by its state which (X or Y) displacement occurred last, and so controls (by way of a gating network and a second bistable stage) the beam intensity as to briefly reduce it whenever X and Y displacements occur alternately.

10 Claims, 2 Drawing Figures

BEAMED-INTENSITY CONTROL SYSTEMS FOR CATHODE-RAY TUBES

This is a continuation, of application Ser. No. 139,467, filed May 3, 1971, now abandoned.

This invention relates to beam-intensity control systems for cathode-ray (CR) tubes.

When it is desired to deflect the beam in incremental X and Y directions so as to draw a continuous trace on a photosensitive surface — on the instructions, say, of a computer — difficulty may be experienced in obtaining on the photographic negative a trace of sufficiently uniform density and width along the line.

Suppose for example that in order to produce a continuous trace the beam is to be deflected in equal incremental distances $dx$ and $dy$ occurring in equal intervals of time $dt$ which are the same for both the X and Y axes. To ensure a smooth line, these incremental distances must be less than the spot diameter. A horizontal trace is produced by deflections in the X direction only, a vertical trace by deflections in the Y direction only; and a sloping trace by suitable alternations of both.

By applying $dx$ and $dy$ deflections alternately while maintaining steady the latest value of the other deflection, a slope of 45° is produced, the incremental length along this direction being $\sqrt{2}$ times the incremental length $dx$ or $dy$. The time required to draw the 45° increment is the time taken to carry out both the $dx$ deflection and the $dy$ deflection, i.e., $2dt$. The rate at which the trace is drawn is thus $\sqrt{2}/2$ times the rate at which a trace parallel to an axis is drawn. As the exposure at any point in a trace is inversely proportional to the rate at which the trace is drawn, the exposure in a trace inclined at 45° is $2/\sqrt{2}$ or $\sqrt{2}$ times the exposure in a trace parallel to an axis.

In general, therefore, a trace inclined to the X and Y axes appears denser on the negative than a trace parallel to one of them.

Furthermore, since a CRT spot is never quite sharply defined, there is an intensity variation along the radius of the spot. As exposure is also proportional to intensity, the amount of exposure varies along the radius of the spot for a given exposure time. If the exposure time increases, as it does when the trace is inclined at 45° as described above, the exposure everywhere in the area of the spot increases. Hence peripheral regions not formerly capable of producing a useful density of trace become able to do so, and the width of the trace increases.

Similarly with slopes at other inclinations.

In general, therefore, a trace inclined to the X and Y axes appears not only denser but also wider on the negative than a trace parallel to one of them — the greater the slope, up to a maximum of 45°, the greater the density and width difference.

This disparity of trace density and width is especially noticeable when the trace is a curve; for the further the curve departs from parallelism with the X or Y axis the thicker it becomes, up to the 45° limit. A circle with its alternate arcs of thick and thin line, therefore, presents an undesirably odd appearance.

A further difficulty is experienced where the trace is required to be of an intermittent nature, to present, say, a chain-dotted appearance and this effect is produced by switching the beam current of the CR tube on and off for predetermined time intervals; in addition to the variation of density and line width with trace velocity and hence with slope, as just described, the lengths of the chain elements being defined by the predetermined fixed time interval for which the beam current is switched on, also vary with velocity and hence with slope — becoming less as the slope increases up to the 45° limit — though the mark/space ratio may remain unaltered.

An object of the invention is accordingly to provide a beam-intensity control system for a CR tube in which such variations of trace density and width with slope are minimised.

Another object is to provide such a system where the variations with slope of the lengths of the elements of an intermittent trace are also minimized.

In accordance with the present invention, a beam-intensity control system for a CR tube arranged for beam deflection by incremental signals in X and Y coordinate directions includes a logic network for distinguishing incremental deflection signals for X and Y directions alternately from signals for either X or Y successively, and timing means for causing the effective beam brightness to be reduced whenever such X and Y signals occur alternately, each such reduction being achieved by interrupting or reducing the beam current for a period less than the duration of a said incremental deflection.

Said logic network may include a first bistable stage, means for energizing that stage to cause it to represent by its stable states which of the X or Y incremental signals has occurred last, a second bistable stage, means controllable in dependence on the state of the second stage to determine the effective brightness of the beam, and gating stages controllable by said first stage and by signals dependent on said X and Y deflection signals to provide a control signal for the second stage, said timing means being such as to cooperate with each control signal from the gating stages so as to cause the effective brightness of the beam to be reduced for a duration defined by the timing means whenever the existing X or Y deflection signal differs from the signal represented by the existing state of the first stage.

Figure 2:
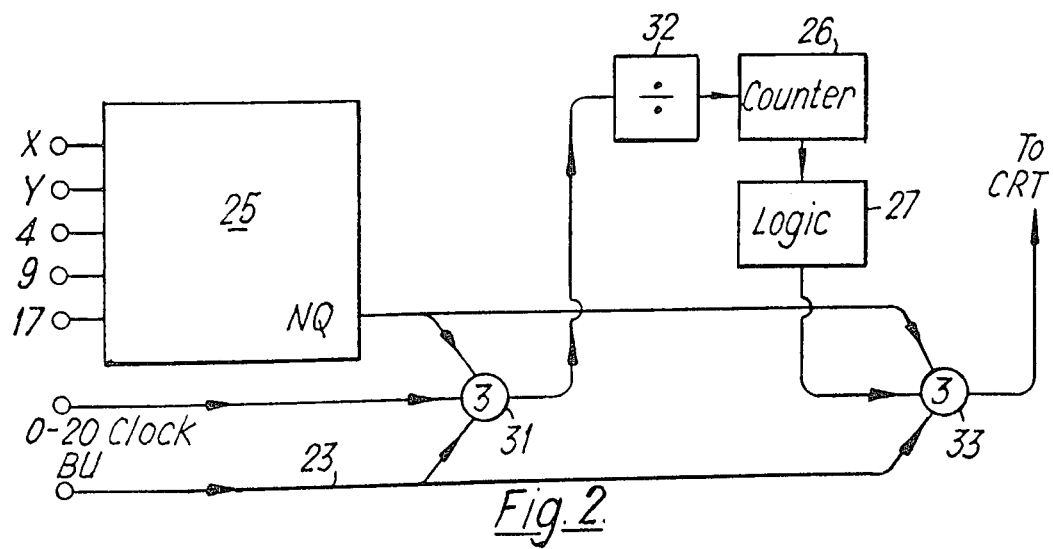

In the accompanying drawings, FIGS. 1 and 2 are schematic diagrams of two embodiments of the invention.

The invention will first be described by way of example as a system for controlling the intensity of the beam of a CR tube 11 in dependence on incremental X and Y signals $dx$ and $dy$, occurring in equal times $dt$, under the instructions of a computer 12.

The computer is programmed to produce a digital pulse in respect of each increment of $dx$ or $dy$ and the resulting trends of digital pulses are converted into a d.c. voltage, varying stepwise, for application to the actual X and Y deflector plates.

For the purpose of the present invention, the computer also supplies over the appropriate one of leads labelled X and Y in the drawings a steady signal throughout each of such trains. These are the signals referred to above as "dependent" on the X and Y deflection signals. They could alternatively be derived from the pulse trains of the deflection signals by a bistable stage arranged to be Set by the first X pulse of a train and remain set till switched to Reset by the first Y pulse of the next Y train, and so on. For brevity, these dependent signals will usually be referred to hereunder merely as the X or the Y signals.

A first bistable stage 13 has two input points S and C ("Signal" and "Clock") and two output points Q and NQ ("not Q"). The Y signal is applied to the signal input point S. To the other input point C is applied a connection from timing means in the form of a clock 14 which is part of computer 12 and is of the kind usually included in a computer for determining the rhythm of the machine. The clock is a continuously running unidirectional 20-pulse counter, causing each incremental distance $dx$ and $dy$, and hence each dependent X and Y signal, to be associated with the 20-pulse count. Where the movement is continuously parallel to the X or to the Y axis, there will of course be a succession of $dx$ or $dy$ movements and of the corresponding dependent signals, each movement and signal being defined by a 20-pulse count.

Each 17th pulse is applied to the input point C of stage 13. The effect of this input clock pulse is to sense the other input S. If a Y signal is present, the clock pulse switches the stage to its Set state, with the Q output energized, i.e., on digit 1, and the NQ output on 0. If on the other hand the clock pulse finds no Y signal present, the stage is switched to its Reset state, with the digits on Q and NQ reversed. If in either of these cases the pulse finds the stage already Set or Reset, as the case may be, the pulse leaves the stage in that state.

These Q and NQ outputs are applied as two of the inputs to two two-entry And gates 15 and 16, the other entries to which are the X and the Y signals respectively. The outputs from these gates are applied as inputs to an Or gate 17 to provide a control signal for the S input of a second bistable stage 21 similar to stage 13.

To the clock input C of stage 21 is applied each third pulse from the clock 14.

The NQ output from stage 21 is applied as one of the two inputs to a two-entry And gate 22. The other input is the bright-up (BU) signal from the computer, applied over a lead 23, and the output is applied to the beam-control electrode 24 of the CR tube.

Stage 21 has a reset facility arranged to be operated to reset the stage by each ninth pulse from the clock. No use is made of the Q output of the stage.

To simplify the description it will be assumed that all effective signals, including the X and Y signals, are positive or positive-going.

In operation, it is assumed to begin with that stage 13 is in its Set state, with its Q output on digit 1.

As a preliminary resetting operation, the computer actuates the circuit by an X signal corresponding to an incremental $dx$ signal and; hence of length defined by 20 clock pulses, followed by a Y signal of similar length. During this operation, the bright-up signal is suppressed, so that no CR trace results.

In its Set state, stage 13 is alerting gate 15, with the result that the first part of the X signal passes gates 15 and 17 to alert stage 21, which is actuated to its Set state (if not already in it) by the third pulse from the clock.

The ninth pulse resets stage 21, leaving output NQ on digit 1.

The 17th pulse senses input S of stage 13; as Y is absent, the stage is switched by that pulse to its Reset state, thereby alerting gate 16 rather than gate 15.

The first part of the Y signal alerts stage 13, left in its Reset state by the X signal, and passes through gates 16 and 17 to alert stage 21. The third clock pulse of the Y signal switches stage 21 to its Set state, from which it is soon reset by the ninth pulse as before. Finally, the 17th pulse actuates the alerted stage 13 to its Set state.

Thus the states in which stages 13 and 21 are left by this preliminary operation are Set and Reset respectively, with stage 21 alerting gate 22 ready to pass the first BU signal from the computer at the start of the actual trace-forming operation.

From the description so far, it will be seen that stage 13 represents by its stable states which of the X or Y incremental deflection signals has occurred last. If the last signal was X, the stage is in its Reset state; if the last signal was Y, the stage is in its Set state.

Similarly stage 21 represents the required effective brightness of the trace, requiring it to be cut off when the stage is in its Set state.

Continuing the description of operation, if the Y signal of the preliminary resetting process is followed by another Y signal the later is blocked by gate 16. Stage 21 is left in its Reset state, undisturbed by the next third clock pulse because of the absence of an enabling signal from gate 17, alerting gate 22 to allow the full intensity of the next BU signal throughout the 20 clock pulses to reach the CR tube. The 17th pulse, finding the Y signal at input S, leaves stage 13 undisturbed in its Set state.

If on the other hand the Y signal is followed by an X signal, the latter passes the alerted gate 15 to alert stage 21, ready for the third clock pulse to switch it to Set and so block gate 22 against the BU signal. However, this interruption is only short, for the ninth pulse resets stage 21 and so reopens the gate. Thus the timing means constituted by the clock 14 cooperates with the control signal from gate 17 to reduce the effective brightness of the beam for a duration defined by the clock when the existing deflection signal differs from the signal represented by the state of stage 13.

The effect of interrupting the BU signal between the 3rd and 9th clock pulses is to reduce the effective brightness of the beam to 14/20ths, or approximately $1/\sqrt{2}$, of the value it posesses when the deflections are successively X or successively Y. Hence the exposure remains approximately the same whether the trace is parallel to an axis or inclined at 45° to them.

As the size of the spot is greater than the length of either the incremental $dx$ or $dy$ extent of its movement, the result of this short interruption of the beam is merely to reduce its effective brightness (and hence the density and width of the trace on the photographic negative) during this X deflection, and so reduce the discrepancy of trace density and width that would otherwise be apparent.

Similarly if a Y signal follows an X. This time stage 13 will be in its Reset state, to which it was switched by the 17th pulse of the previous clock count. With gate 16 thus alerted, the Y signal alerts stage 21 ready for the 3rd pulse to switch it to its Set state for five clock pulses and so diminish the effective beam brightness over that interval as happened when an X signal follows a Y.

If at the start of the initial resetting process stage 13 is in its Reset state, the X signal is blocked by gate 15 and so fails to alert stage 21. This however is of no consequence, for stage 21 would in any case be left in its Reset state by the ninth pulse of the next count. At the end of the ensuing Y signal the 17th pulse switches stage 13 to its Set state as before.

Stage 13 and the ensuing gates 15 and 16 thus constitute a kind of logical network which acts to distinguish the condition in which the incremental X and Y signals occur alternately, from the condition in which either the X or the Y signals occur successively, thereby allowing the effective beam intensity to be reduced, or left unaltered, as the case may be.

Where the trace is to be of an interrupted kind, and the lengths of its elements are required to be kept as constant as is practicable despite changes in the slope of the trace, the apparatus of FIG. 1 may be extended as shown in FIG. 2.

Here the block 25 represents the components included within the chain-dotted line 25 in FIG. 1.

The actual nature of the broken line, such as the mark/space ratio, is determined by a pattern generator in the form of a counter 26 and logic network 27. The latter derives from the changing pattern of energization of stages of the counter the mark/space signal required to modulate the CR tube beam, the changeover point of that signal occurring on the passage of the counter through predetermined critical states. Since the length of the elements of the interrupted line are thus defined by the duration of the mark and space portions of the signal, they necessarily vary with the velocity of the spot.

Conveniently, the counter is stepped by frequency-division from the clock 14 of the computer (see FIG. 1). The clock pulses are applied as one input to a three-entry And gate 31, to the other two inputs of which are applied the BU signal and the NQ output from stage 21 in the group of components 25. From gate 31, when alerted by the NQ and BU inputs, the clock pulses pass to counter 26 by way of a stage 32 which performs the required frequency division. The mark/space signal from network 27 is applied together with the NQ and BU signals to a three-entry And gate 33, the output from which is applied to the beam-control electrode 24 of the CR tube.

The operation need only be indicated briefly.

So long as either the X or the Y signals occur successively, so that the NQ output from stage 21 remains steadily on digit 1, the clock pulses pass through gate 31 to step the counter 26 whenever the computer supplied the BU signal to indicate that the trace is required. The resulting pattern set up by network 27 passes through gate 33, alerted (as is gate 31) by the NQ and BU signals, to the beam-control electrode 24.

Whenever X and Y signals occur alternately, indicating a slope in the trace, the digit 0 on point NQ closes gates 31 and 33 for the short duration between the third and ninth clock pulses.

In addition to having the effect of reducing the trace density and width, as in the case of a continuous line, by closing gate 33 for a few clock pulses, the simultaneous blocking of gate 31 has the effect of arresting the counter and so reducing the number of input pulses into stage 32 and counter 26, thus increasing the time taken by the counter to reach the critical states from which the logic stage 27 derives a signal determining the mark/space ratio of the signal applied to gate 33. This has the effect of slightly increasing the durations of the elements of the broken line to compensate for their tendency to shorten with slope as described above.

The above-described arrangements may be modified in various ways with the scope of the invention.

For example, the interval over which the beam is cut off may be defined by other pulses from clock 14 than the third and the ninth; the first and seventh, say, could serve as well. The clock 14 may be arranged to define each incremental movement by a number of pulses other than 20. Thus 30 pulses coule be used instead; in which case a cut-off interval of nine pulses would reduce the effective beam intensity to 21/30th, which again is approximately $1/\sqrt{2}$.

Further, the effective brightness of the beam may be reduced by interrupting it for several periods instead of just one, as described; or by dimming it over one or more periods instead of interrupting it.

What we claim is:

1. In a logic circuit for use in conjunction with a beam intensity control system for a cathode-ray rube arranged to have its beam deflected in X and Y co-ordinate directions by trains of incremental X or Y deflection signals occurring at different times and derived from a digital computer also having derived therein signals dependent on said X and Y incremental deflection signals to the extent of remaining steady throughout each train of successive incremental X or Y deflection signals as the case may be, a train of timing pulses a predetermined number of which are associated with each incremental signal and a brightness control signal adapted to be applied to the beam-control electrode of the cathode ray tube the improvement comprising first means for providing a control signal distinguishing the condition in which the incremental X and Y deflection signals occur alternately, from the condition in which either the X or Y signals occur successively, second means for applying to said first means said dependent signals and selected signals from said pulse train such that said first means provides said control signal which distinguishes the alternate incremental deflection signal for X and Y directions from repeated signals for either X or Y directions, and third means responsive to other selected signals from said pulse train and said control signal from said first means for controlling the application of said brightness control signal to the beam control electrode such that the effective brightness of the beam is reduced whenever said X and Y incremental signals occur alternately.

2. A logic circuit as set forth in claim 1 wherein said third means includes an AND gate arranged for interrupting the beam current for a period less than the duration of a set incremental deflection to thereby control the effective brightness of the beam.

3. A logic circuit as set forth in claim 1 wherein said third means includes a gate for reducing the beam current for a period less than the duration of a said incremental deflection to thereby control the effective brightness of the beam of the cathode ray tube.

4. A logic circuit as set forth in claim 1 wherein said first means includes a first bistable stage and means for energizing said first bistable stage to a first stable state or a second stable state so as to represent by the state of said bistable stage which of the X or Y incremental signals has occurred last.

5. A logic circuit as set forth in claim 4 wherein said third means includes a second bistable stage and means controllable in dependence on the state of said second bistable stage to control the effective brightness of the beam.

6. A logic circuit as set forth in claim 5 further including gating stages controllable by said first stage and by signals dependent on said X and Y deflection signals to provide said control signal for the second bistable stage and timing pulses being such as to cooperate with each control signal from the gating stages so as to energize the second bistable stage and thereby control the effective brightness of the beams to be reduced for a duration defined by the timing pulses whenever the existing X or Y deflection signal differs from the signal represented by the existing state of the first bistable stage.

7. A logic circuit having an output signal dependent upon the order of occurrence of a first and a second signal comprising first means for providing a control signal distinguishing the condition in which the first and the second signal occur alternately from the condition in which either said first or said second signals occur successively, second means for applying to said first means input signals dependent on said first and second signals to the extent of remaining steady throughout the presence of a train of said first or said second signals, as the case may be, and selected signals from a pulse train of input timing signals such that said first means provides said control signal which distinguishes said condition when said first and second occur alternately from the condition when said first and second signals occur successively and third means responsive to other selected signals from said pulse train of timing signals and said control signal for developing said output signal.

8. A logic circuit as set forth in claim 7 wherein said first means includes a first bistable stage adapted to be energized between a first and a second stable state to represent by the state of said bistable stage the order of occurrence of said first and said second signal.

9. A logic circuit as set forth in claim 8 wherein said third means includes a second bistable stage.

10. A logic circuit as set forth in claim 9 wherein said first means includes a first and a second AND gate each having a first and a second input and an output, said first input of said first AND gate being connected to receive said first signal, said first input of said second AND gate being connected to receive said second signal, said second inputs of said first and said second AND gates being connected to said first bistable stage so as to alert said first and said second AND gates in response to the state of said bistable stage so as to pass said first signal upon the presence thereof when said first bistable stage is in its first state and said second signal upon the presence thereof when said first bistable stage is in its second state and an OR gate having its inputs connected to the outputs of said AND gates to receive the signals passed thereby and develop said control signal.

* * * * *